United States Patent
Shang et al.

(10) Patent No.: US 9,224,498 B2
(45) Date of Patent: Dec. 29, 2015

(54) SHIFT REGISTER UNIT, GATE DRIVING DEVICE FOR DISPLAY AND LIQUID CRYSTAL DISPLAY

(75) Inventors: Guangliang Shang, Beijing (CN); Seung Woo Han, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 232 days.

(21) Appl. No.: 13/106,947

(22) Filed: May 13, 2011

(65) Prior Publication Data

US 2011/0286572 A1  Nov. 24, 2011

(30) Foreign Application Priority Data

May 19, 2010 (CN) .......................... 2010 1 0181646

(51) Int. Cl.
*G09G 3/36* (2006.01)
*G11C 19/28* (2006.01)

(52) U.S. Cl.
CPC .............. *G11C 19/28* (2013.01); *G09G 3/3677* (2013.01); *G09G 2310/0286* (2013.01)

(58) Field of Classification Search
USPC ..................................................... 377/64–81
See application file for complete search history.

(56) References Cited

U.S. PATENT DOCUMENTS

| | | |
|---|---|---|
| 5,990,877 A | 11/1999 | Yeo |
| 2002/0149318 A1 | 10/2002 | Jeon et al. |
| 2003/0179174 A1 | 9/2003 | Matsuda et al. |
| 2006/0290390 A1* | 12/2006 | Jang et al. ...................... 327/112 |
| 2007/0296662 A1 | 12/2007 | Lee et al. |
| 2008/0219401 A1* | 9/2008 | Tobita ............................. 377/79 |
| 2009/0073105 A1 | 3/2009 | Chiang et al. |
| 2009/0256794 A1* | 10/2009 | Jang et al. ...................... 345/100 |
| 2010/0110047 A1 | 5/2010 | Yoon et al. |

FOREIGN PATENT DOCUMENTS

| | | |
|---|---|---|
| CN | 1526141 A | 9/2004 |
| CN | 101388253 A | 3/2009 |
| CN | 101546607 A | 9/2009 |
| JP | 2004-005904 A | 1/2004 |
| JP | 2007-004167 A | 1/2007 |
| JP | 2008-003602 A | 1/2008 |

(Continued)

OTHER PUBLICATIONS

Analog Integrated Circuit Design, David A. Johns, 1997.*

(Continued)

*Primary Examiner* — Quan-Zhen Wang
*Assistant Examiner* — Chad Dicke
(74) *Attorney, Agent, or Firm* — Ladas & Parry LLP

(57) ABSTRACT

A shift register unit includes an input module for inputting a second clock signal or a third clock signal, and for inputting a frame starting signal, a first clock signal, a low voltage signal, a reset signal as well as a first signal and a second signal transmitted from a next neighboring shift register unit; a processing module for generating a gate driving signal and allowing a level of at least one of first junctions formed by at least two TFTs to be maintained at low level in a frame interval during which the second clock signal or the third clock signal inputted from the input module is maintained at low level; and an output module for transmitting the gate driving signal generated by the processing module.

4 Claims, 12 Drawing Sheets

(56) References Cited

FOREIGN PATENT DOCUMENTS

| | | |
|---|---|---|
| JP | 2010-107968 A | 5/2010 |
| KR | 20040099649 A | 12/2004 |
| KR | 20070118386 A | 12/2007 |
| KR | 1020090050358 A | 5/2009 |
| KR | 20090109257 A | 10/2009 |

OTHER PUBLICATIONS

KIPO Notice of Allowance of Patent; Appln. No. 10-2011-0047446; dated Dec. 26, 2012.

Japanese Office Action dated Aug. 19, 2015; Appln. No. 2011-111541.

* cited by examiner

SHIFT REGISTER UNIT, GATE DRIVING DEVICE FOR DISPLAY AND LIQUID CRYSTAL DISPLAY

TECHNICAL FIELD

Embodiments of this invention relate to a shift register unit, a gate driving device for display and a liquid crystal display.

BACKGROUND

To display, a gate driving device may be used in some displays.

Taking a liquid crystal display as an example, at time of displaying images, the liquid crystal display often employs a progressive scan manner in which ON and OFF of thin film transistors (TFTs) in each row of sub-pixel areas are controlled by a gate-line, and a gate driving signal for driving the gates of respective TFTs is generated by a gate driving device which typically includes a plurality of shift register units.

A shift register unit generally includes a plurality of TFTs. In conjunction with a clock signal, a frame starting signal and a reset signal or the like that are inputted, the plurality of TFTs generate a gate driving signal which is to be transmitted to TFTs as switching elements in the sub-pixel areas on the array substrate.

A junction may be formed by at least two of these TFTs, and some junctions may be at high level for a long time. In this way, some TFTs, whose gates are connected to these junctions, may be under a relatively large bias voltage for a long time, hence lifespan of those TFTs, whose gates are connected to these junctions, is reduced, and stability of shift register unit is badly influenced.

SUMMARY

In an embodiment of present invention, there is provided a shift register unit including: an input module for inputting a second clock signal or a third clock signal, and for inputting a frame starting signal, a first clock signal, a low voltage signal, a reset signal as well as a first signal and a second signal transmitted from a next neighboring shift register unit, wherein in one frame interval, the second clock signal is same as an inverse signal of the first clock signal, and the third clock signal is maintained at low level, while in a next neighboring frame interval, the third clock signal is same as the first clock signal, and the second clock signal is maintained at low level, and wherein one frame interval includes a display time of one or more frames; a processing module connected to the input module, including at least two thin film transistors (TFTs), for generating a gate driving signal in accordance with the second clock signal or the third clock signal inputted from the input module, and the frame starting signal, the first clock signal as well as the first signal and the second signal transmitted from the next neighboring shift register unit, allowing a level of at least one of first junctions formed by at least two TFTs to be maintained at low level in a frame interval during which the second clock signal or the third clock signal inputted from the input module is maintained at low level; and an output module connected to the processing module, for transmitting the gate driving signal generated by the processing module.

In a further embodiment of present invention, there is provided a gate driving device for display comprising a plurality of n+1 above-mentioned shift register units that are sequentially connected, n being a natural number, wherein expect for the first shift register unit and the (n+1)th shift register unit, an output module of each of shift register units is connected to an input module of a previous neighboring shift register unit as well as an input module of a next neighboring shift register unit, a gate driving signal outputted from each of shift register units is transmitted to a previous neighboring shift register unit as a reset signal for the previous neighboring shift register unit, and the gate driving signal outputted from each of shift register units is transmitted to a next neighboring shift register unit as a frame starting signal for the next neighboring shift register unit; an output module of the first shift register unit is connected to an input module of the second shift register unit, and a gate driving signal outputted from the first shift register unit is inputted to the second shift register unit as a frame starting signal for the second shift register unit; and an output module of the (n+1)th shift register unit is connected to an input module of the n-th shift register unit, and a gate driving signal outputted from the last shift register unit is transmitted to the n-th shift register unit as a reset signal for the n-th shift register unit; the output module of the last shift register unit is connected to the input module thereof, and a gate driving signal outputted from the last shift register unit is transmitted to the input module thereof as a reset signal thereof.

In a still further embodiment of present invention, there is provided a liquid crystal display comprising the above-mentioned gate driving device for display.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 3b shows a timing chart of input and output signals in a third shift register unit $SR_3$ shown in FIG. 3a;

FIG. 5b shows a timing chart of input and output signals of the gate driving device for display shown in FIG. 5a;

FIG. 6b shows a timing chart of input and output signals of the shift register unit shown in FIG. 6a;

DETAILED DESCRIPTION

In following embodiments of present invention, a description will be made primarily by taking a liquid crystal display as an example. However, the shift register unit and the gate driving device presented in the embodiments of present invention are not limited to those used for a liquid crystal display, and also can be applied to other kinds of displays such as an organic light-emitting display (OLED) and the like.

Figure 1:
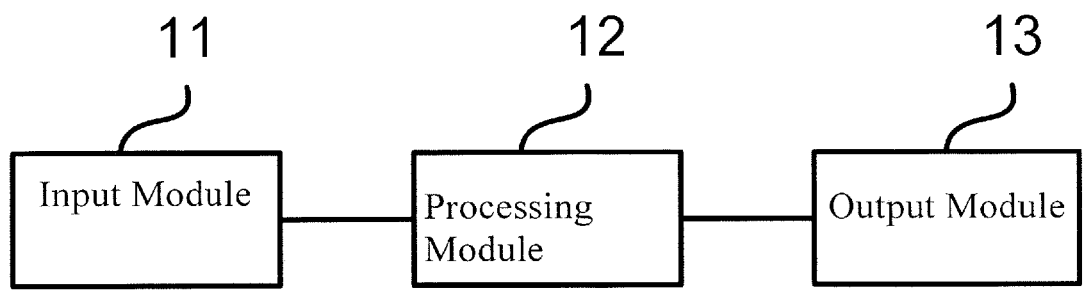
FIG. 1 is a diagram showing a structure for a shift register unit according to an embodiment of present invention.

FIG. 1 is a block diagram showing a structure for a shift register unit according to an embodiment of present invention. This shift register unit includes an input module 11, a processing module 12 and an output module 13. The input module 11 is used for inputting a second clock signal or a third clock signal, and for inputting a frame starting signal, a first clock signal, a low voltage signal, a reset signal as well as a first signal and a second signal transmitted from a next neighboring shift register unit. In one frame interval, the second clock signal is same as the inverse signal of the first clock signal, and the third clock signal is maintained at low level, while in a next neighboring frame interval, the third clock signal is same as the first clock signal, and the second clock signal is maintained at low level; here one frame interval may include a display time of one or more frames. Connected to the input module 11, the processing module 12 includes at least two TFTs, and is used for generating a gate driving signal in accordance with the second clock signal or the third clock signal inputted from the input module, and the frame starting signal, the first clock signal as well as the first signal and the second signal transmitted from the next neighboring shift register unit, and allowing a level of at least one of first junctions formed by at least two TFTs to be maintained at low level in a frame interval during which the second clock signal or the third clock signal inputted from the input module 11 is maintained at low level. Connected to the processing module 12, the output module 13 is used for transmitting the gate driving signal generated by the processing module 12.

Figure 2:
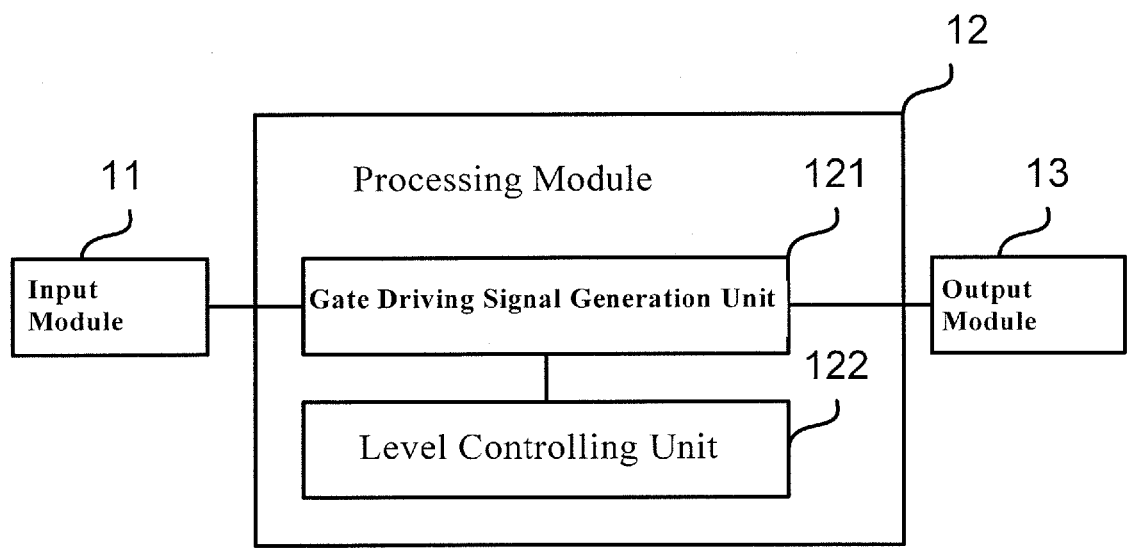
FIG. 2 is a diagram showing a structure for a first embodiment of the shift register unit according to the embodiment of present invention.

FIG. 2 is a diagram showing a structure for a first embodiment of the shift register unit. In this embodiment, the processing module 12 includes a gate driving signal generation unit 121 and a level controlling unit 122. Connected to the input module 11, the gate driving signal generation unit 121 includes at least two TFTs, and is used for generating the gate driving signal in accordance with the second clock signal or the third clock signal inputted from the input module 11, and the frame starting signal, the first clock signal as well as the first signal and the second signal transmitted from the next neighboring shift register unit. Connected to the gate driving signal generation unit 121, a level controlling unit 122 is used for allowing a level of at least one of first junctions formed by at least two TFTs to be maintained at low level in a frame interval during which the second clock signal or the third clock signal inputted from the input module 11 is maintained at low level.

Figure 3A:
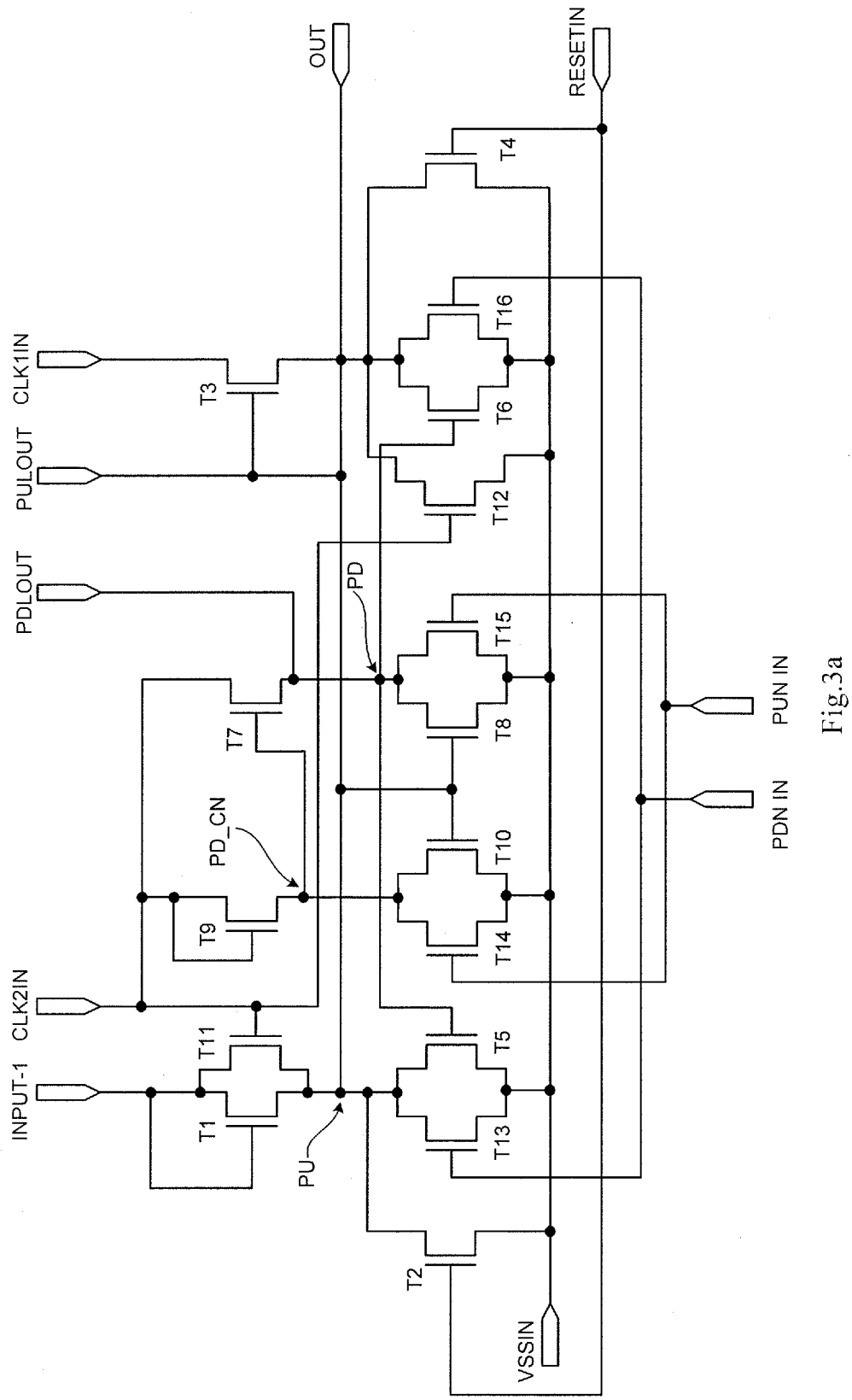
FIG. 3a is a diagram showing a structure for a second embodiment of the shift register unit according to the embodiment of present invention.

FIG. 3a is a diagram showing a structure for a second embodiment of the shift register unit. In this embodiment, the input module 11 includes a starting signal input terminal (INPUT-1), a first clock signal input terminal (CLK1IN), a second clock signal input terminal (CLK2IN), a first signal input terminal (PDNIN), a second signal input terminal (PUDIN), a low voltage signal input terminal (VSSIN) and a reset signal input terminal (RESETIN). The starting signal input terminal (INPUT-1) is used for inputting the frame starting signal. The first clock signal input terminal (CLK1IN) is used for inputting the first clock signal. The second clock signal input terminal (CLK2IN) is used for inputting the second clock signal or the third clock signal. The first signal input terminal (PDNIN) is used for inputting the first signal inputted from the next neighboring shift register unit of this shift register unit. The second signal input terminal (PUDIN) is used for inputting the second signal inputted from the next neighboring shift register unit of this shift register unit. The low voltage signal input terminal (VSSIN) is used for inputting the low voltage signal. The reset signal input terminal (RESETIN) is used for inputting the reset signal.

The output module 13 includes a gate driving signal output terminal (OUT), a first signal output terminal (PDLOUT) and a second signal output terminal (PULOUT). The gate driving signal output terminal (OUT) is used for transmitting the gate driving signal generated by the processing module. The first signal output terminal (PDLOUT) is used for outputting a third signal to a previous neighboring shift register unit of this shift register unit. The second signal output terminal (PULOUT) is used for outputting a fourth signal to the previous neighboring shift register unit of this shift register unit.

The gate driving signal generation unit 121 includes a first TFT T1, a second TFT T2, a third TFT T3, a fourth TFT T4, a fifth TFT T5, a sixth TFT T6, a seventh TFT T7, an eighth TFT T8, a ninth TFT T9, a tenth TFT T10, an eleventh TFT T11 and a twelfth TFT T12.

The gate and drain of the first TFT T1 are both connected to the starting signal input terminal (INPUT-1). The drain of the second TFT T2 is connected to the source of the first TFT T1, the gate thereof is connected to the reset signal input terminal (RESETIN), and the source thereof is connected to the low voltage signal input terminal (VSSIN). The drain of the third TFT T3 is connected to the first clock signal input terminal (CLK1IN), the gate and the source thereof are connected to the second signal output terminal (PULOUT), and the source thereof is also connected to its gate and the gate driving signal output terminal (OUT) The gate of the fourth TFT T4 is connected to the reset signal input terminal (RESETIN), the drain thereof is connected to the source of the third TFT T3, and the source thereof is connected to the low voltage signal input terminal (VSSIN). The drain of the fifth TFT T5 is connected to the source of the first TFT T1, and the source thereof is connected to the low voltage signal input terminal (VSSIN). The drain of the sixth TFT T6 is connected to the source of the third TFT T3, and the source thereof is connected to the low voltage signal input terminal (VSSIN). The source of the seventh TFT T7 is connected to the gate of the fifth TFT T5, the gate of the sixth TFT T6 and the first signal output terminal (PDLOUT). The gate of the eighth TFT T8 is connected to the source of the first TFT T1, the drain thereof is connected to the source of the seventh TFT T7, and the source thereof is connected to the low voltage signal input terminal (VSSIN). The source of the ninth TFT T9 is connected to the gate of the seventh TFT T7. The gate of the tenth TFT T10 is connected to the source of the first TFT T1, the drain thereof is connected to the source of the ninth TFT T9, and the source thereof is connected to the low voltage signal input terminal (VSSIN). The source of the eleventh TFT T11 is connected to the starting signal input terminal (INPUT-1), the drain thereof is connected to the source of the first TFT T1, and the gate thereof is connected to the second clock signal input terminal (CLK2IN). The drain of the twelfth TFT T12 is connected to the source of the third TFT T3, the source thereof is connected to the low voltage signal input terminal (VSSIN), and the gate thereof is connected to the second clock signal input terminal (CLK2IN). The location where the source of the first TFT T1, the drain of the second TFT T2, the drain of the fifth TFT T5, the gate of the tenth TFT T10, the gate of the eighth TFT T8 and the gate of the three TFT T3 gather together forms a second junction. In the embodiments of present invention, the second junction is referred to as PU junction. The location where the source of the seventh TFT T7, the drain of the eighth TFT T8, the gate of the fifth TFT T5 and the gate of the sixth TFT T6 gather together forms a first junction. In the embodiments of present invention, the first junction is referred to as PD junction. The location where the source of the ninth TFT T9 and the gate of the seventh TFT T7 gather together foams a third junction. In the embodiments of present invention, the third junction is referred to as PD_CN junction.

In FIG. 3a, the level controlling unit 122 includes a thirteenth TFT T13, a fourteenth TFT T14, a fifteenth TFT T15 and a sixteenth TFT T16.

The gate of the thirteenth TFT T13 is connected to the first signal input terminal (PDNIN), the drain thereof is connected to the drain of the fifth TFT T5 and the source of the first TFT T1, and the source thereof is connected to the low voltage signal input terminal (VSSIN). The gate of the fourteenth TFT T14 is connected to the second signal input terminal (PUNIN), the drain thereof is connected to the drain of the tenth TFT T10 and the source of the ninth TFT T9, and the source thereof is connected to the low voltage signal input terminal (VSSIN). The gate of the fifteenth TFT T15 is connected to the second signal input terminal (PUNIN), the drain thereof is connected to the drain of the eighth TFT T8 and the source of the seventh TFT 17, and the source thereof is connected to the low voltage signal input terminal (VSSIN). The gate of the sixteenth TFT T16 is connected to the first signal input terminal (PDNIN), the drain thereof is connected to the drain of the sixth TFT T6 and the source of the third TFT T3, and the source thereof is connected to the low voltage signal input terminal (VSSIN).

Figure 4:
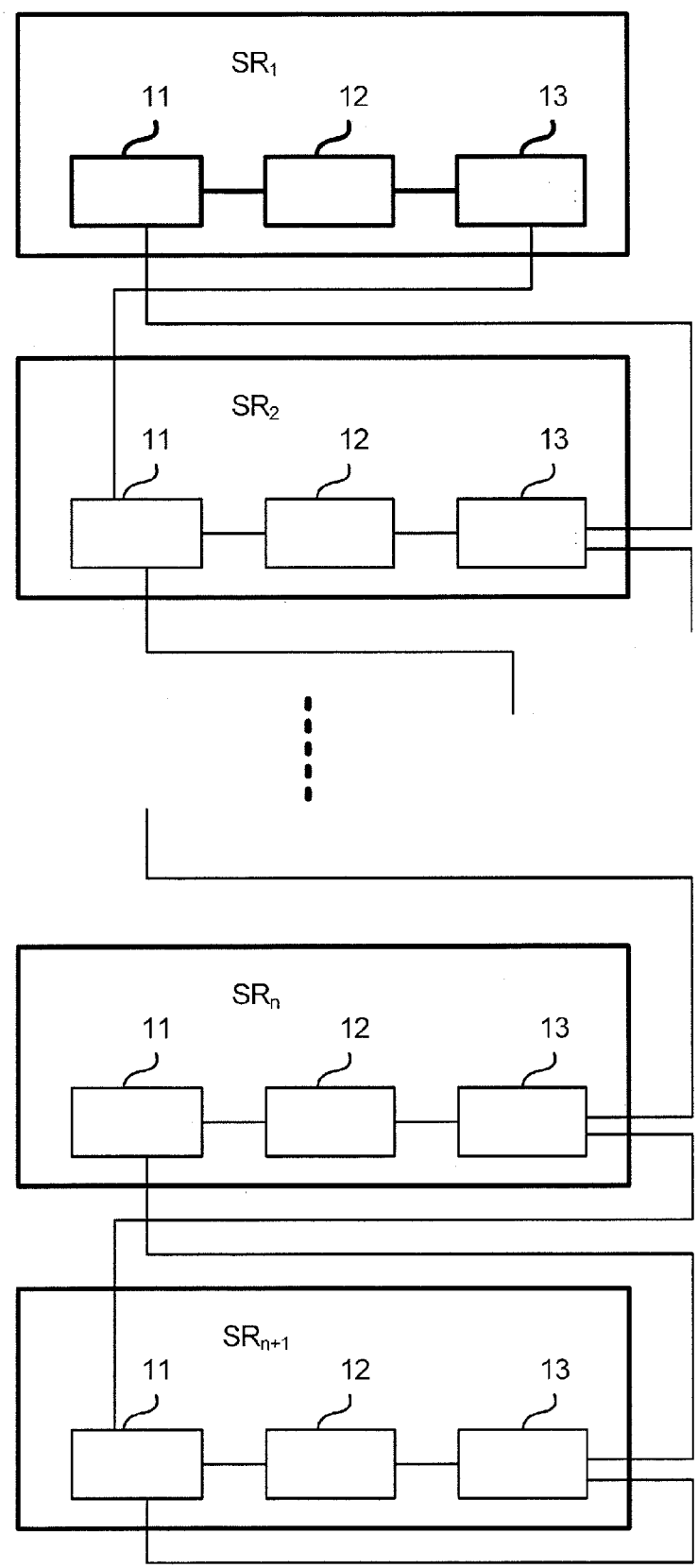
FIG. 4 is a diagram showing a structure for a gate driving device for display according to an embodiment of present invention.

FIG. 4 is a diagram showing a structure for a gate driving device for display according to an embodiment of present invention. As shown in the drawing, the device comprises a plurality of (n+1) shift register units sequentially connected, which respectively is labeled with $SR_1$, $SR_2$, . . . , $SR_{n+1}$, wherein expect for the first shift register unit $SR_1$ and the (n+1)th shift register unit $SR_{n+1}$, the output module 13 of each of shift register units is connected to the input module 11 of a previous neighboring shift register unit as well as the input module 11 of a next neighboring shift register unit. Therefore, a gate driving signal outputted from each of shift register units is transmitted to a previous neighboring shift register unit as a reset signal for the previous neighboring shift register unit, and the gate driving signal outputted from each of shift register units is transmitted to a next neighboring shift register unit as a frame starting signal for the next neighboring shift register unit. The output module 13 of the first shift register unit $SR_1$ is connected to the input module 11 of the second shift register unit $SR_2$, and the gate driving signal outputted from the first shift register unit $SR_1$ is inputted to the second shift register unit $SR_2$ as the frame starting signal for the second shift register unit $SR_2$. The output module 13 of the last shift register unit $SR_{n+1}$ is connected to the input module 11 of the n-th shift register unit $SR_n$, and the gate driving signal outputted from the last shift register unit $SR_{n+1}$ is transmitted to the n-th shift register unit $SR_n$ as the reset signal for the n-th shift register unit $SR_n$. The output module 13 of the last shift register unit $SR_{n+1}$ is connected to the input module 11 thereof, and the gate driving signal outputted from the last shift register unit $SR_{n+1}$ is transmitted to the input module 11 thereof as a reset signal thereof.

Figure 5A:
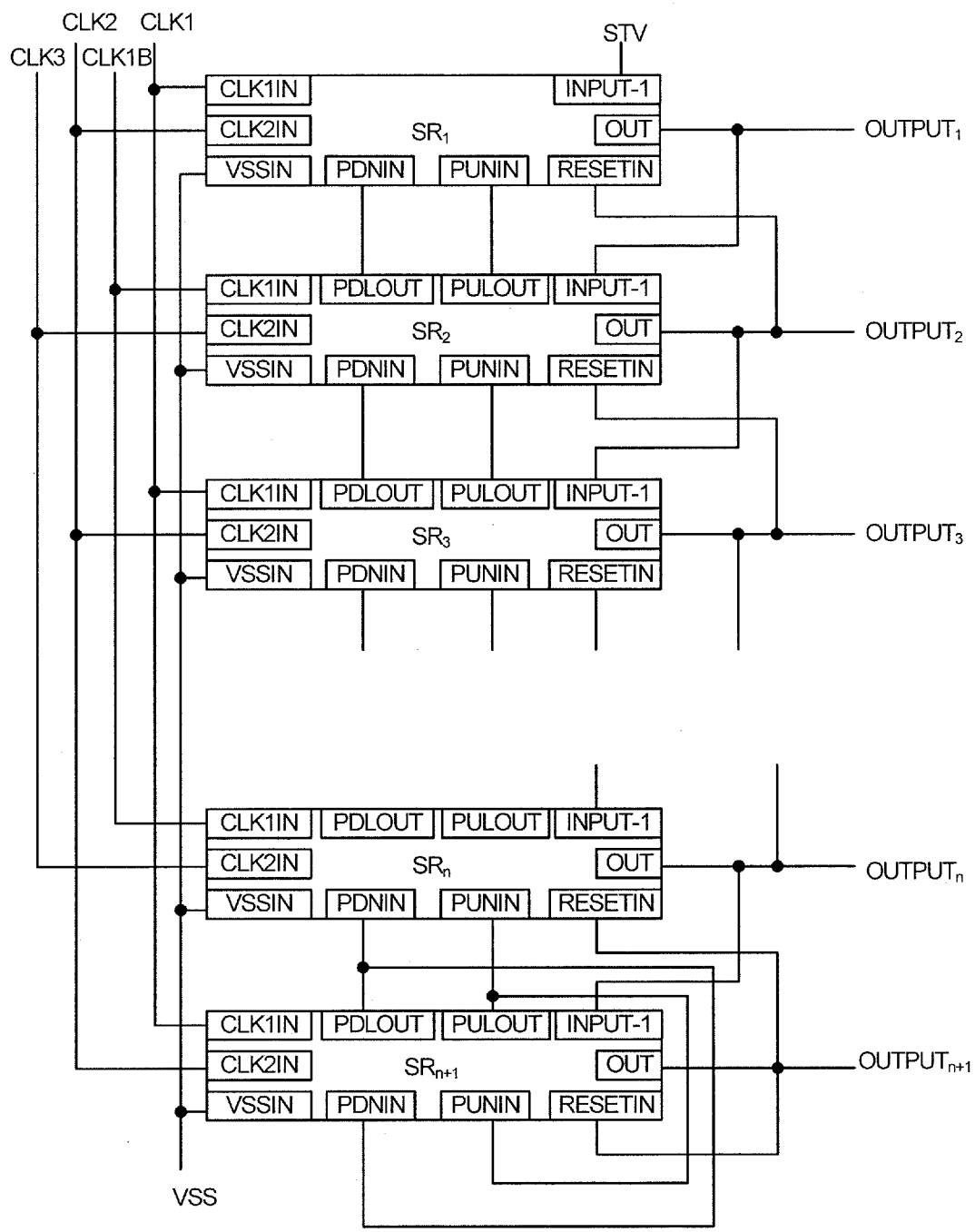
FIG. 5a is a diagram showing a structure for a first embodiment of the gate driving device for display according to the embodiment of present invention.

FIG. 5a is a diagram showing a structure for a first embodiment of the gate driving device for display according to the embodiment of present invention. In this embodiment, a plurality of (n+1) shift register units shown in FIG. 3a is included. Expect for the first shift register unit $SR_1$ and the last shift register unit $SR_{n+1}$, the gate driving signal output terminal (OUT) of each of shift register units is connected to the reset signal input terminal (RETSETIN) of a previous neighboring shift register unit and the starting signal input terminal (INPUT-1) of a next neighboring shift register unit. The gate driving signal output terminal (OUT) of the first shift register unit $SR_1$ is connected to a starting signal input terminal (OUT) of the second shift register unit $SR_2$. The gate driving signal output terminal (OUT) of the (n+1)th shift register unit $SR_{n+1}$ is respectively connected to the reset signal input terminal (RETSETIN) of a neighboring n-th shift register unit $SR_n$ and the reset signal input terminal thereof (RETSETIN). For each of shift register units except for the first one $SR_1$ and the last one $SR_{n+1}$, the first signal output terminal (PDLOUT) is connected to the first signal input terminal (PDNIN) of a previous neighboring shift register unit, the second signal output terminal (PULOUT) is the second signal input terminal (PUNIN) of a previous neighboring shift register unit, the first signal input terminal (PDNIN) is connected to the first signal output terminal (PDLOUT) of a next neighboring shift register unit, and the second signal input terminal (PUNIN) is connected to the second signal input terminal of a next neighboring shift register unit. For the first shift register unit $SR_1$, the first signal input terminal (PDNIN) is connected to the first signal output terminal (PDLOUT) of the second shift register unit $SR_2$, and the second signal input terminal (PUNIN) is connected to the second signal output terminal (PULOUT) of the second shift register unit $SR_2$. For the (n+1)th shift register unit $SR_{n+1}$, the first signal output terminal (PDLOUT) and the first signal input terminal (PDNIN) are both connected to the first signal input terminal (PDNIN) of the n-th shift register unit $SR_n$, and the second signal output terminal (PULOUT) and the second signal input terminal (PUNIN) are both connected to the second signal input terminal (PUNIN) of the n-th shift register unit $SR_n$.

The connection manner of respective shift register units in the gate driving device for display according to the embodiment of present invention can be seen in conjunction with FIGS. 3a and 5a. Hereinafter, a timing relation of input and output signals of a single shift register unit as well as that of a gate driving device for display will be described.

Figure 5B:
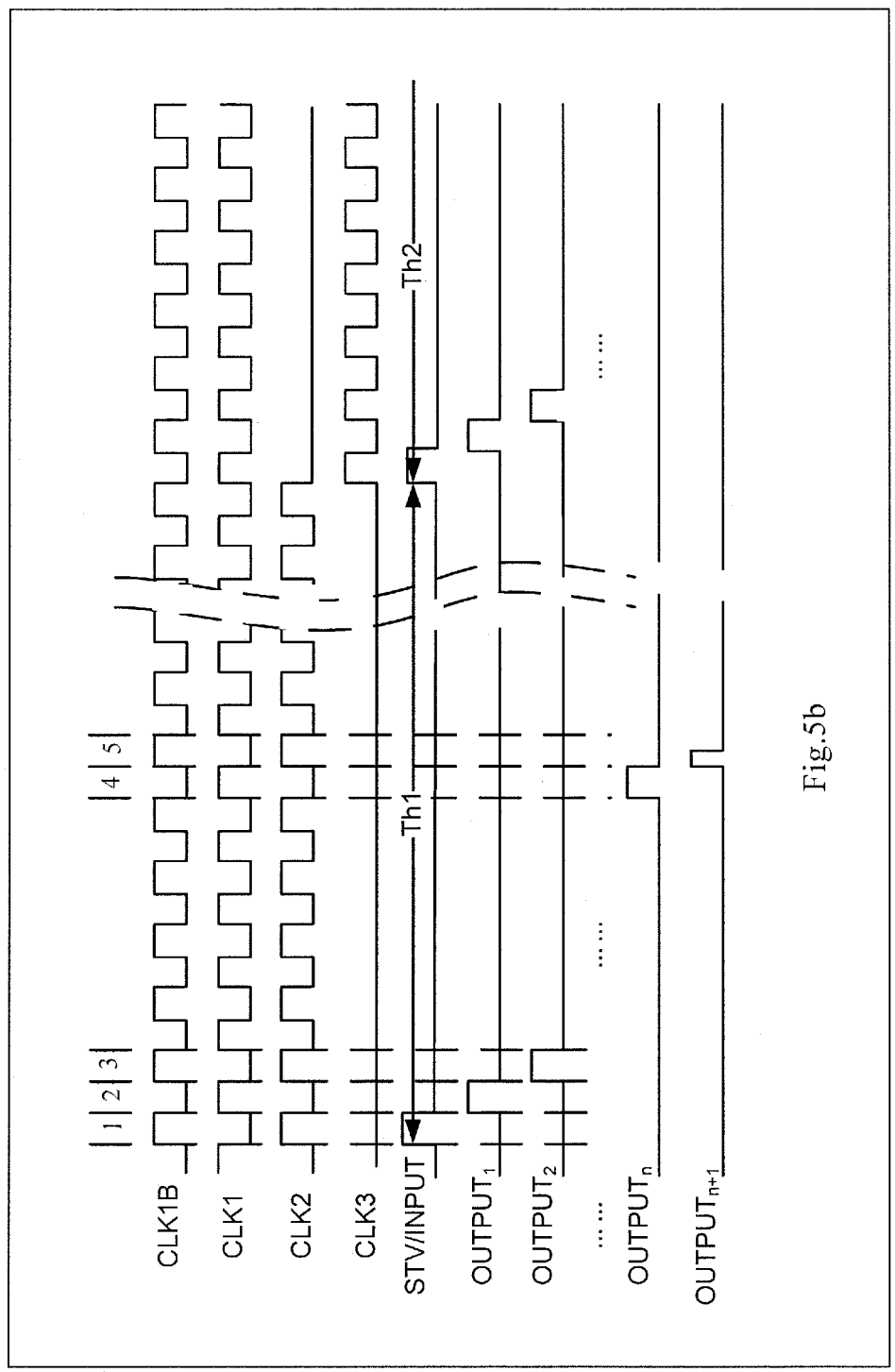

FIG. 5b shows a timing chart of input and output signals of the gate driving device for display shown in FIG. 5a. In FIG. 5b, the timing chart of input and output signals of one type of gate driving device for display is shown. The timing chart of input and output signals of other types of gate driving device for display is similar, and can be comprehended with reference to the principle for gate driving device of liquid crystal display. STV is a frame starting signal, which is inputted to the starting signal input terminal (INPUT-1) of the first shift register unit $SR_1$. The starting signal input terminal (INPUT-1) of each of the other shift register units is connected to the gate driving signal output terminal (OUT) of a previous neighboring shift register unit. That is, inputted into the starting signal input terminal (INPUT-1) of the other shift register units is the gate driving signal (OUTPUT) outputted from a previous neighboring shift register unit, and a gate driving signal output from a shift register unit serves as a frame starting signal of a next neighboring shift register unit. In FIG. 5b, INPUT is a signal inputted into the starting signal input terminal (INPUT-1) of all other shift register units except for the first shift register unit $SR_1$. Each of shift register units outputs a gate driving signal (OUTPUT) for driving a row of gate lines in the liquid crystal display. A low voltage signal (VSS) (not shown in FIG. 5b) is inputted into the low voltage signal input terminal (VSSIN) for each of shift register units. The first clock signal (CLK1) is inputted into the first clock signal input terminal (CLK1IN) of the i-th shift register unit SRi, and the second clock signal (CLK2) is inputted into the second clock signal input terminal (CLK2IN), where i is of an odd number. If (n+1) is of an odd number, i=1, 3, 5, . . . , n+1. If i is of an even number, i=1, 3, 5, . . . , n. An inverse signal (CLK1B) of the first clock signal is inputted into the first clock signal input terminal (CLK1IN) of the (i+1)th shift register unit $SR_{i+1}$, and the third clock signal (CLK3) is inputted into the third clock signal input terminal (CLK2IN).

Figure 3B:
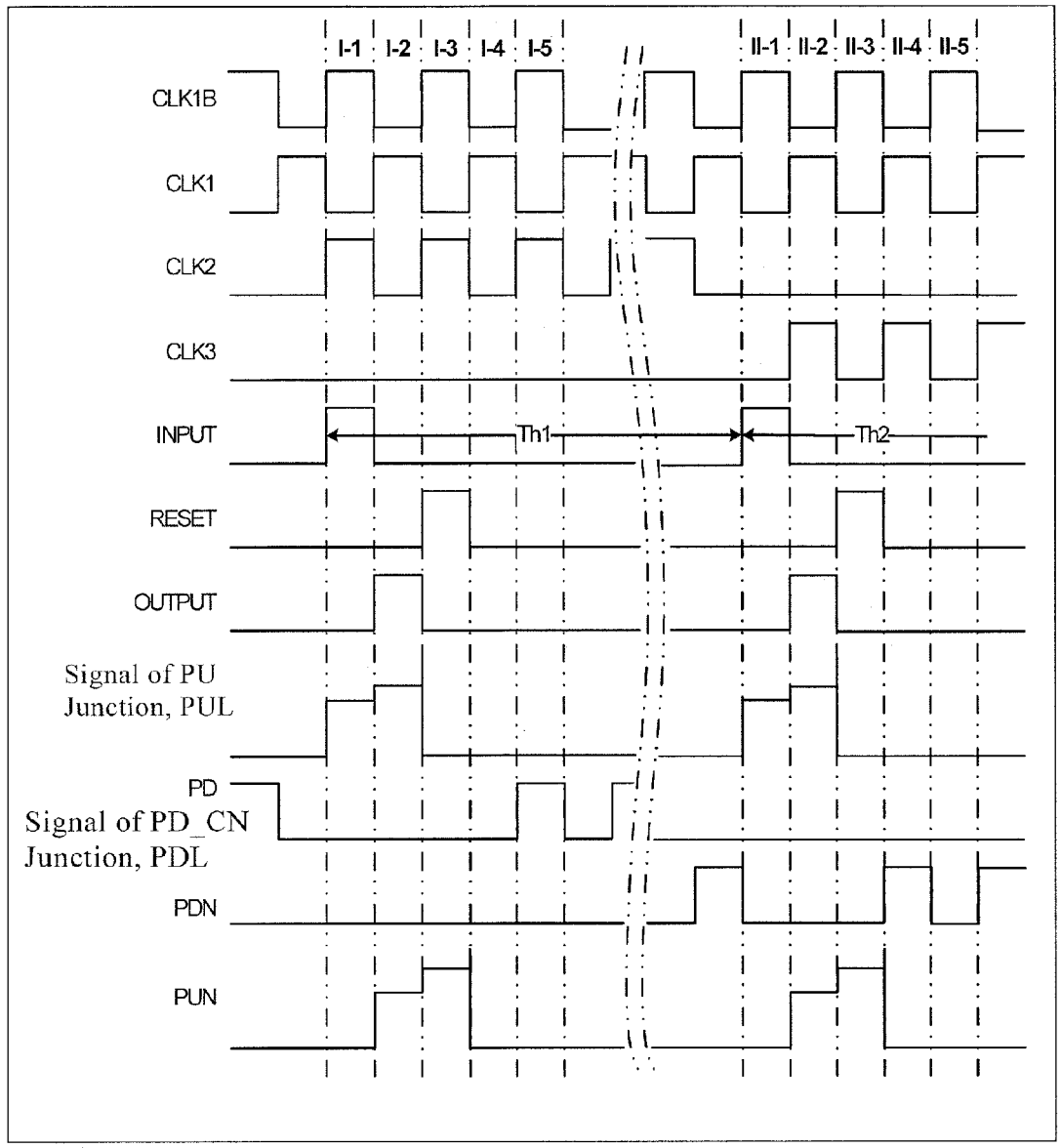

FIG. 3b shows a timing chart of input and output signals in the third shift register unit $SR_3$ shown in FIG. 5a. In FIG. 3b, the timing chart of input and output signals of one type of gate driving device for display is shown. The timing chart of input and output signals of other types of gate driving device for display is similar, and can be comprehended with reference to the principle for gate driving device of liquid crystal display. A signal of (INPUT) is inputted into the starting signal input terminal (INPUT-1). A first clock signal (CLK1) is inputted into the first clock signal input terminal (CLK1IN), and a second clock signal (CLK2) is inputted into the second clock signal input terminal (CLK2IN). A low voltage signal (VSS) is inputted into the low voltage signal input terminal (VSSIN). A reset signal (RESET) is inputted into the reset signal input terminal (RESETIN). A gate driving signal (OUTPUT) is outputted from the gate driving signal output terminal (OUT). The low voltage signal (VSS), which is not shown in FIG. 3b, is a signal maintained at low voltage all the time. The first signal output terminal (PDLOUT) of the fourth shift register unit $SR_4$ outputs a signal of (PDN) which is inputted into the first signal input terminal (PDLIN) of the third shift register $SR_3$ and can be regarded as the first signal. The second signal output terminal (PULOUT) of the fourth shift register unit $SR_4$ outputs a signal of (PUN) which is inputted into the second signal input terminal (PULIN) of the third shift register $SR_3$ and can be regarded as the second signal. Signal (PDL), which is outputted from the first signal output terminal (PDLOUT) of the third shift register unit $SR_3$, is inputted into the first signal input terminal (PDNIN) of the second shift register $SR_2$ and can be regarded as the third signal. Signal (PUL), which is outputted from the second signal output terminal (PULOUT) of the third shift register unit $SR_3$, is inputted into the second signal input terminal (PUNIN) of the second shift register $SR_2$ and can be regarded as the fourth signal.

With respect to the third shift register $SR_3$, the second clock signal (CLK2) is inputted into the second clock signal input terminal (CLK2IN). However, since signals including PDN and PUN generated by the fourth shift register $SR_4$ also have to be inputted into the third shift register $SR_3$ and the generation of the signals including PDN and PUN depends on the third clock signal (CLK3), the third clock signal CLK3 is together shown in FIG. 3b.

In the embodiments of present invention, a frame interval, represented by $T_{hold}$, includes a display time of one or more frames. That is, a frame interval is equivalent to an interval from starting moment of a rising edge of the frame starting signal (STV) to starting moment of a certain rising edge thereafter. Generally, $T_{hold}$ is integer time(s) of time interval for scanning one frame image of the display, which is one time at least and up to tens or even hundreds times. As can be seem from FIG. 5b, in different frame intervals, the shape of the second clock signal (CLK2) is different from that of the third clock signal (CLK3). Two neighboring frame intervals are shown in FIGS. 5b and 3a, which respectively are Th1 and Th2.

As can be seen from FIG. 3b, the second clock signal (CLK2) is same as inverse signal (CLK1B) of the first clock signal in T1, and remains at low level in T2. The third clock signal (CLK3) remains at low level during Th1, and is same as the first clock signal (CLK1) during Th2.

Figure 5C:
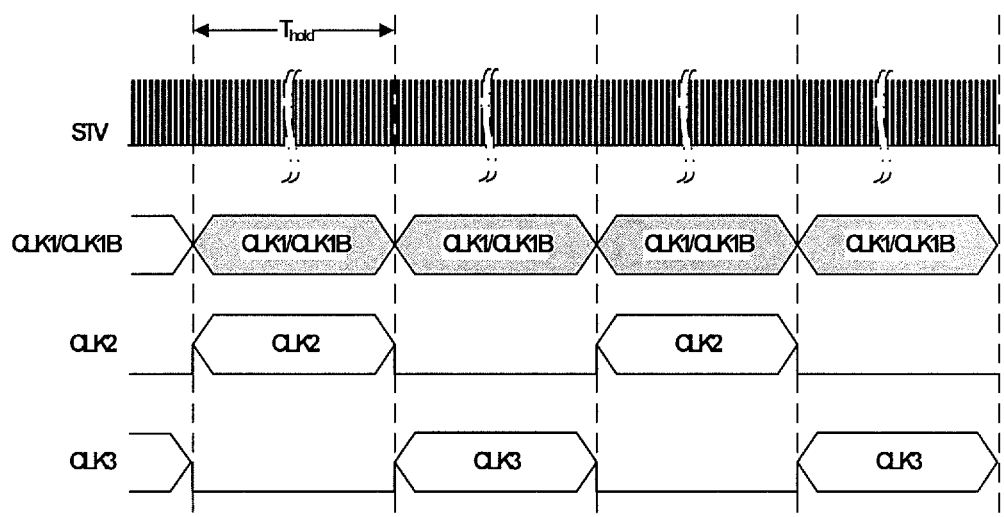
FIG. 5c shows a simplified timing chart to that of FIG. 5b.

FIG. 5c shows a simplified timing chart of FIG. 5b. In FIG. 5c, the relation among the second clock signal (CLK2), the third clock signal (CLK3) and the frame starting signal (STV) can be seen more clearly.

Hereinafter, the principle of operation for shift register units according to the embodiments of present invention will be explained in connection with FIGS. 3a and 3b.

In the embodiments of present invention, although a frame interval may include a display time of one or more frames, each of frame intervals is of the same length once the length of frame interval is determined. That is, Th1 and Th2 in FIG. 3b are of the same length.

From Th1, five periods, respectively labeled with I-1, I-2, I-3, I-4 and I-5, are extracted. From Th2, five periods, respectively labeled with II-1, II-2, II-3, II-4 and II-5, are extracted.

(First) During Th1

As can be seen in connection with structures shown in FIGS. 3a and 5a, during the time interval of Th1, the third clock signal (CLK3) is maintained at low level, thus the signal (PDN) inputted from the third shift register $SR_3$ is maintained at low level, and the thirteenth TFT T13 and the fourteenth TFT T14 in the third shift register $SR_3$ remain conductive.

1, (I-1) Period

The signal (INPUT) is at high level; the reset signal (RESET) is at low level; the first TFT T1 is turned on; the signal of PU junction is at high level, that is to say, the signal (PUL) outputted from the third shift register $SR_3$ is at high level. Since the signal of PU junction is at high level, the third TFT T3, the eighth TFT T8 and the tenth TFT T10 are turned on.

The signal (PUN) is at low level, and the fifteenth TFT T15 and the fourteenth TFT T14 are turned off.

The first clock signal (CLK1) is at low level, while the second clock signal (CLK2) is at high level, and the seventh TFT T7, the ninth TFT T9, the eleventh TFT T11 and the twelfth TFT T12 are turned on. By setting a ratio of W/L (where W/L indicates a ratio of width to length) of channel for the seventh TFT T7 to W/L of channel for the eighth TFT T8, as well as a ratio of W/L of channel for the ninth TFT T9 to W/L of channel for the tenth TFT T10, the signal of PD junction can be brought into low level, thus the fifth TFT T5 and the sixth TFT T6 are turned off. The ratio of W/L of channel for the seventh TFT T7 to W/L of channel for the eighth TFT T8 may range from 1/1 to 1/50, and a ratio of W/L of channel for the ninth TFT T9 to W/L of channel for the tenth TFT T10 may range from 1/1 to 1/50.

The reset signal (RESET) is at low level, and the second TFT T2 and T4 are turned off. Therefore, the gate driving signal (OUTPUT) is at low level, the signal (PDL) is at low level, and the signal (PUL) is at high level.

2, (I-2) Period

The signal (INPUT) is changed to low level; the first TFT T1 is turned off; the reset signal (RESET) is at low level; the signal of PU junction is maintained at high level, that is to say, the signal (PUL) outputted from the third shift register SR$_3$ is still at high level. Since the signal of PU junction is maintained at high level, the third TFT T3, the eighth TFT T8 and the tenth TFT T10 are turned on.

The signal (PUN) is at high level, thus the fourteenth TFT T14 and the fifteenth TFT T15 are turned on.

The second clock signal (CLK2) is at low level; the seventh TFT T7, the ninth TFT T9, the eleventh TFT T11 and the twelfth TFT T12 are turned off; the signal of PD junction is maintained at low level. Thus the fifth TFT T5 and the sixth TFT T6 remain nonconductive.

The reset signal (RESET) is at low level, and the second TFT T2 and the fourth TFT T4 remain nonconductive.

The first clock signal (CLK1) is at high level, and the third TFT T3 is turned on. Therefore, the gate driving signal (OUTPUT) is at high level. The signal (PUL) is at high level, and the signal (PDL) is at low level.

3, (I-3) Period

The signal (INPUT) is at low level; the reset signal (RESET) is at high level; the second TFT T2 and the fourth TFT T4 are turned on; the signal of PU junction is changed into low level. Thus the third TFT T3, the eighth TFT T8 and the tenth TFT T10 are turned off.

The signal (PUN) is at high level, and the fourteenth TFT T14 and the fifteenth TFT T15 remain conductive.

The second clock signal (CLK2) is at high level; the seventh TFT T7, the ninth TFT T9, the eleventh TFT T11 and the twelfth TFT T12 are turned on. However, the signal (PUN) is at high level at this moment, then the fourteenth TFT T14 and the fifteenth TFT T15 are turned on. By setting a ratio of W/L of channel for the ninth TFT T9 to W/L of channel for the fourteenth TFT T14, as well as a ratio of W/L of channel for the seventh TFT T7 to W/L of channel for the fifteenth TFT T15 (for example, a ratio of W/L may range from 1/1 to 1/50), the signal of PD junction still remains at low level, thus the fifth TFT 15 and the sixth TFT T6 remain nonconductive.

The first clock signal (CLK1) is at low level, and the second TFT T2 and the fourth TFT T4 are turned on. Since the sources of the second TFT T2 and the fourth TFT T4 are connected to the low voltage signal input terminal (VSSIN), the gate driving signal (OUTPUT) is changed into low level. The signal (PDL) is maintained at low level, and the signal (PUL) is changed into low level.

4, (I-4) Period

The signal (INPUT) is at low level, and the first TFT T1 remains nonconductive. The reset signal (RESET) is at low level, and the signal of PU junction is at low level, that is to say, the signal (PUL) outputted from the third shift register SR$_3$ is at low level. Since the signal of PU junction is at low level, the eighth TFT T8 and the tenth TFT T10 are turned off.

The signal (PUN) is at low level, and the fourteenth TFT T14 and the fifteenth TFT T15 are turned off.

The second clock signal (CLK2) is at low level, and the seventh TFT 17, the ninth TFT T9, the eleventh TFT T11 and the twelfth TFT T12 are turned off. The signal of PD junction remains at low level, thus the fifth TFT 15 and the sixth TFT T6 are turned off.

The reset signal (RESET) is at low level; the second TFT T2 and the fourth TFT T4 are turned off; the gate driving signal (OUTPUT) remains at low level. The signal (PUL) is at low level, and the signal (PDL) is at low level.

5, (I-5) Period

The signal (INPUT) is at low level, and the first TFT T1 is turned off. The reset signal (RESET) is at low level, and the signal of PU junction remains at low level. The eighth TFT T8 and the tenth TFT T10 remain nonconductive.

The signal (PUN) is at low level, and the fourteenth TFT T14 and the fifteenth TFT T15 remain nonconductive.

The second clock signal (CLK2) is at high level; the seventh TFT T7, the ninth TFT T9, the eleventh TFT T11 and the twelfth TFT T12 are turned on; the signal of PD junction is at high level, thus the fifth TFT T5 and the sixth TFT T6 are turned on.

The reset signal (RESET) is at low level; the second TFT T2 and the fourth TFT T4 are turned off; the gate driving signal (OUTPUT) remains low level.

In FIG. 3b, only part of the timing chart for the shift register unit is drawn. Every time the display displays one frame image, the shift register unit controlling a certain row of liquid crystal pixels would output a high level gate driving signal, and the signal (INPUT), the reset signal (RESET), the first clock signal (CLK1) and the second clock signal (CLK2) would repeat the timing chart of the periods of I-1, I-2, I-3 once again. During a time when the display displays one frame image, with respect to the time except for the periods of I-1, I-2, I-3, the signal (INPUT), the reset signal (RESET), the first clock signal (CLK1) and the second clock signal (CLK2) would repeat a same timing as that of the periods of I-4 and I-5.

(Second) During Th2

As can be seen in connection with structures shown in FIGS. 3a and 5a, during Th2, the second clock signal (CLK2) is maintained at low level, thus the fifth TFT T5, the sixth TFT T6, the seventh TFT T7, the ninth TFT T9, the eleventh TFT T11 and the twelfth TFT T12 remain nonconductive; the signal of PD junction remains at low level; the signal (PDL) outputted from the third shift register SR$_3$ also remains at low level.

1, (II-1) Period

The signal (INPUT) is at high level; the reset signal (RESET) is at low level; the first TFT T1 is turned on; the signal of PU junction is at high level, that is to say, the signal (PUL) outputted from the third shift register SR$_3$ is at high level. Since the signal of PU junction is at high level, the third TFT T3, the eighth TFT T8 and the tenth TFT T10 are turned on.

The signal (PUN) is at low level, and the fifteenth TFT T15 and the fourteenth TFT T14 are turned off.

The signal (PDN) is at low level, and the thirteenth TFT T13 and the sixteenth TFT T16 are turned off.

The reset signal (RESET) is at low level, the second TFT T2 and T4 are turned off, and the first clock signal (CLK1) is at low level. Therefore, the gate driving signal (OUTPUT) is at low level, the signal (PDL) is at low level, and the signal (PUL) is at high level.

2, (II-2) Period

The signal (INPUT) is changed to low level; the first TFT T1 is turned off; the reset signal (RESET) is at low level; the signal of PU junction is maintained at high level, that is to say, the signal (PUL) outputted from the third shift register SR$_3$ is at high level. Since the signal of PU junction is maintained at high level, the third TFT T3, the eighth TFT T8 and the tenth TFT T10 are turned on.

The signal (PUN) is at high level, thus the fourteenth TFT T14 and the fifteenth TFT T15 are turned on.

The signal (PDN) is at low level, and the thirteenth TFT T13 and the sixteenth TFT T16 remain nonconductive.

The reset signal (RESET) is at low level, and the second TFT T2 and the fourth TFT T4 remain nonconductive.

The first clock signal (CLK1) is at high level, and the third TFT T3 is turned on. Therefore, the gate driving signal (OUTPUT) is at high level. The signal (PUL) is at high level, and the signal (PDL) is at low level.

3, (II-3) Period

The signal (INPUT) is at low level; the reset signal (RESET) is at high level; the second TFT T2 and the fourth TFT T4 are turned on; the signal of PU junction is changed into low level. Thus the third TFT T3, the eighth TFT T8 and the tenth TFT T10 are turned off.

The signal (PUN) is at high level, and the fourteenth TFT T14 and the fifteenth TFT T15 remain conductive.

The signal (PDN) is at low level, and the thirteenth TFT T13 and the sixteenth TFT T16 remain nonconductive.

The first clock signal (CLK1) is at low level, and the second TFT T2 and the fourth TFT T4 are turned on. Since the sources of the second TFT T2 and the fourth TFT T4 are connected to the low voltage signal input terminal (VSSIN), the gate driving signal (OUTPUT) is changed into low level. The signal (PDL) remains at low level, and the signal (PUL) is changed into low level.

4, (II-4) Period

The signal (INPUT) is at low level, and the first TFT T1 remains nonconductive. The reset signal (RESET) is at low level, and the signal of PU junction is at low level. That is, the signal (PUL) outputted from the third shift register $SR_3$ is at low level. Since the signal of PU junction is at low level, the eighth TFT T8 and the tenth TFT T10 are turned off.

The signal (PUN) is at low level, and the fourteenth TFT T14 and the fifteenth TFT T15 are turned off.

The signal (PDN) is at high level, and the thirteenth TFT T13 and the sixteenth TFT T16 are turned on.

The reset signal (RESET) is at low level; the second TFT T2 and the fourth TFT T4 are turned off; the gate driving signal (OUTPUT) remains at low level. The signal (PUL) is at low level, and the signal (PDL) is at low level.

5, (II-5) Period

The signal (INPUT) is at low level, and the first TFT T1 is turned off. The reset signal (RESET) is at low level, and the signal of PU junction is maintained at low level. The eighth TFT T8 and the tenth TFT T10 remain nonconductive.

The signal (PUN) is at low level; the fourteenth TFT T14 and the fifteenth TFT T15 remain nonconductive.

The reset signal (RESET) is at low level; the second TFT T2 and the fourth TFT T4 are turned off; the gate driving signal (OUTPUT) remains low level.

In FIG. 3b, only part of timing chart for the shift register unit is drawn. Every time the display displays one frame image, the shift register unit controlling a certain row of liquid crystal pixels would output a high level gate driving signal, and the signal (INPUT), the reset signal (RESET), the first clock signal (CLK1) and the second clock signal (CLK2) would repeat the timing chart of periods of II-1,II-2,II-3 once again. During a time when the display displays one frame image, with respect to a time except for the periods of II-1, II-2,II-3, the signal (INPUT), the reset signal (RESET), the first clock signal (CLK1) and the second clock signal (CLK2) would repeat a same timing as that of the II-4 and II-5.

In the shift register unit presented in the embodiments of present invention, in the Th2, that is, in a frame interval when the second clock signal CLK2 remains at low level, the signal of PD junction remains at low level all the time, thus the time period when the fifth TFT T5 and the sixth TFT T6, the gates of which are connected to the PD junction, are turned on can be reduced, hence lifespan for the fifth TFT T5 and the sixth TFT T6 can be lengthened.

FIG. 3b shows a timing chart of input and output signals in a third shift register unit $SR_3$. For the other shift register units, if the third clock signal is inputted into the second clock signal input terminal (CLK2IN), in a frame interval when the third clock signal remains at low level, the signal of PD junction remains at low level, thus the time period when the fifth TFT T5 and the sixth TFT T6, the gates of which are connected to the PD junction, are turned on can be reduced, and hence lifespan for the fifth TFT T5 and the sixth TFT T6 can be lengthened. The timing chart of input and output signals in the other shift register units is same as that of FIG. 3b, and will not be repeated.

Figure 6A:
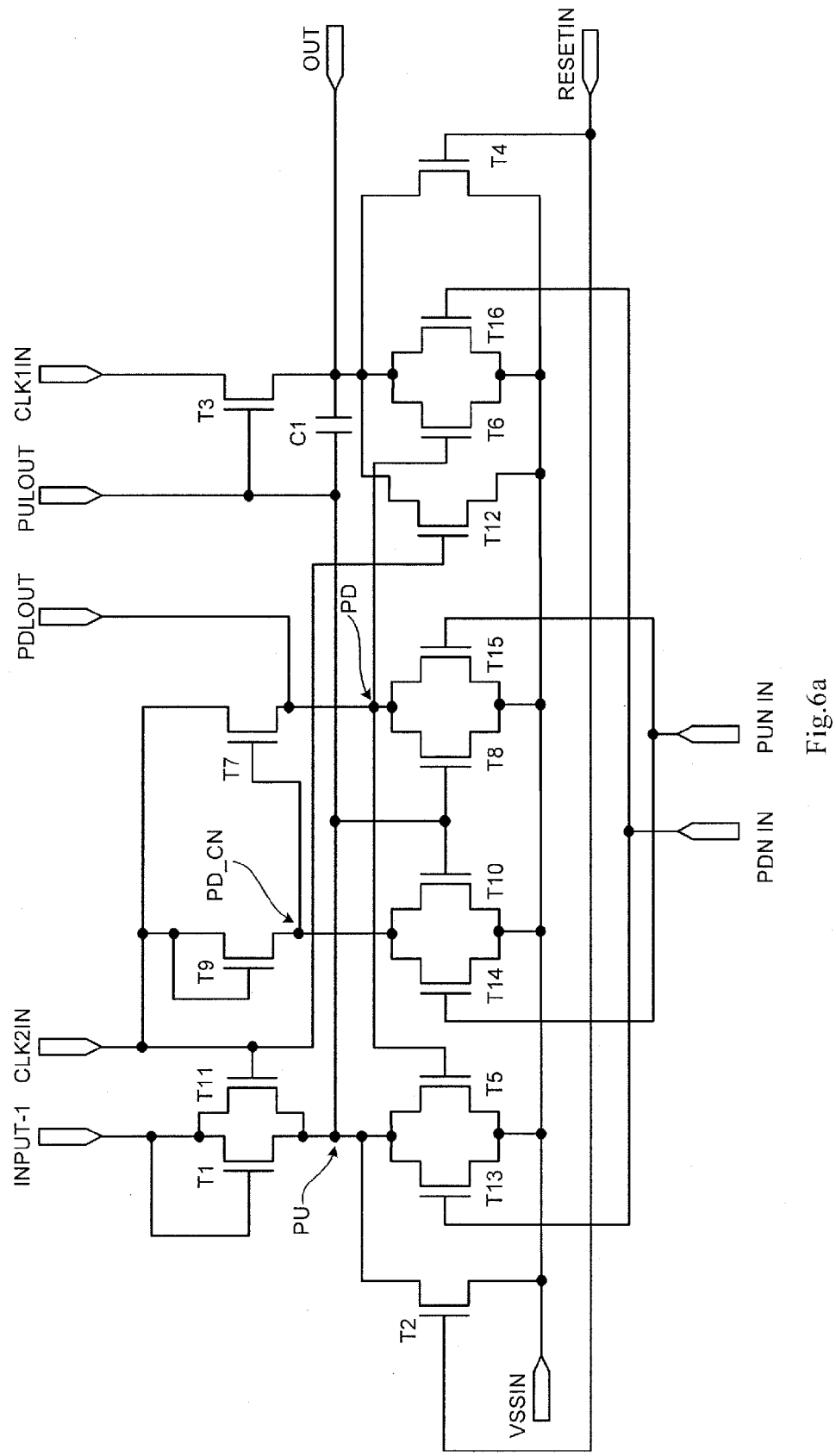
FIG. 6a is a diagram showing a structure for a third embodiment of the shift register unit according to the embodiment of present invention.
Figure 6B:
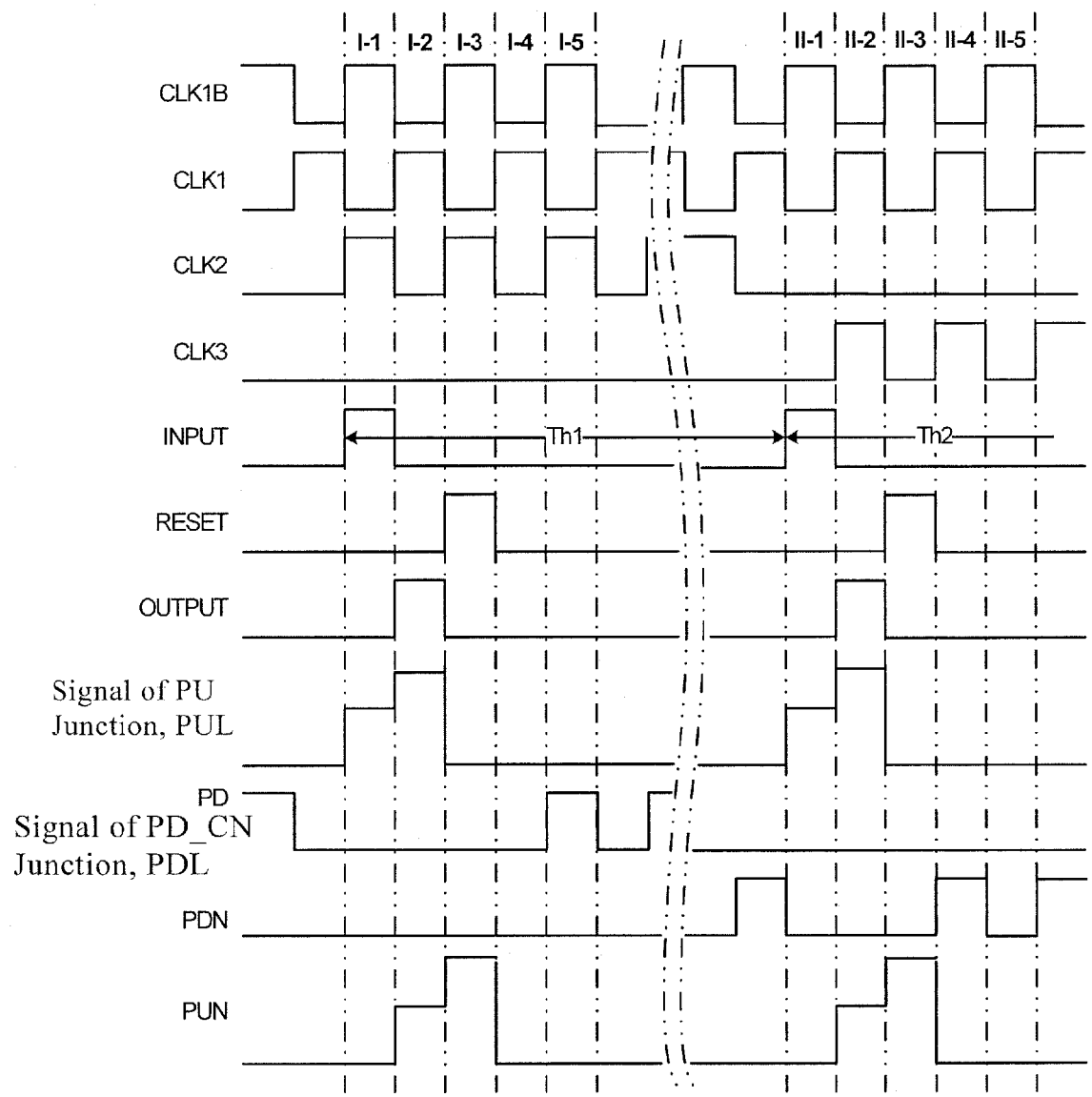

FIG. 6a a diagram showing a structure for a third embodiment of the shift register unit. FIG. 6b shows a timing chart of input and output signals of the shift register unit shown in FIG. 6a. This embodiment differs from the second embodiment shown in FIG. 3a in that a capacitor C1, of which one terminal is connected to the source of the third TFT T3 and the other terminal is connected to the gate of the third TFT T3, is added. The timing chart shown in FIG. 6b differs from that of FIG. 3b in that during periods of I-2 and II-2, due to a coupling effect by the capacitor C1, the signal level of PU junction in FIG. 6b is higher than that of FIG. 3b.

Figure 7:
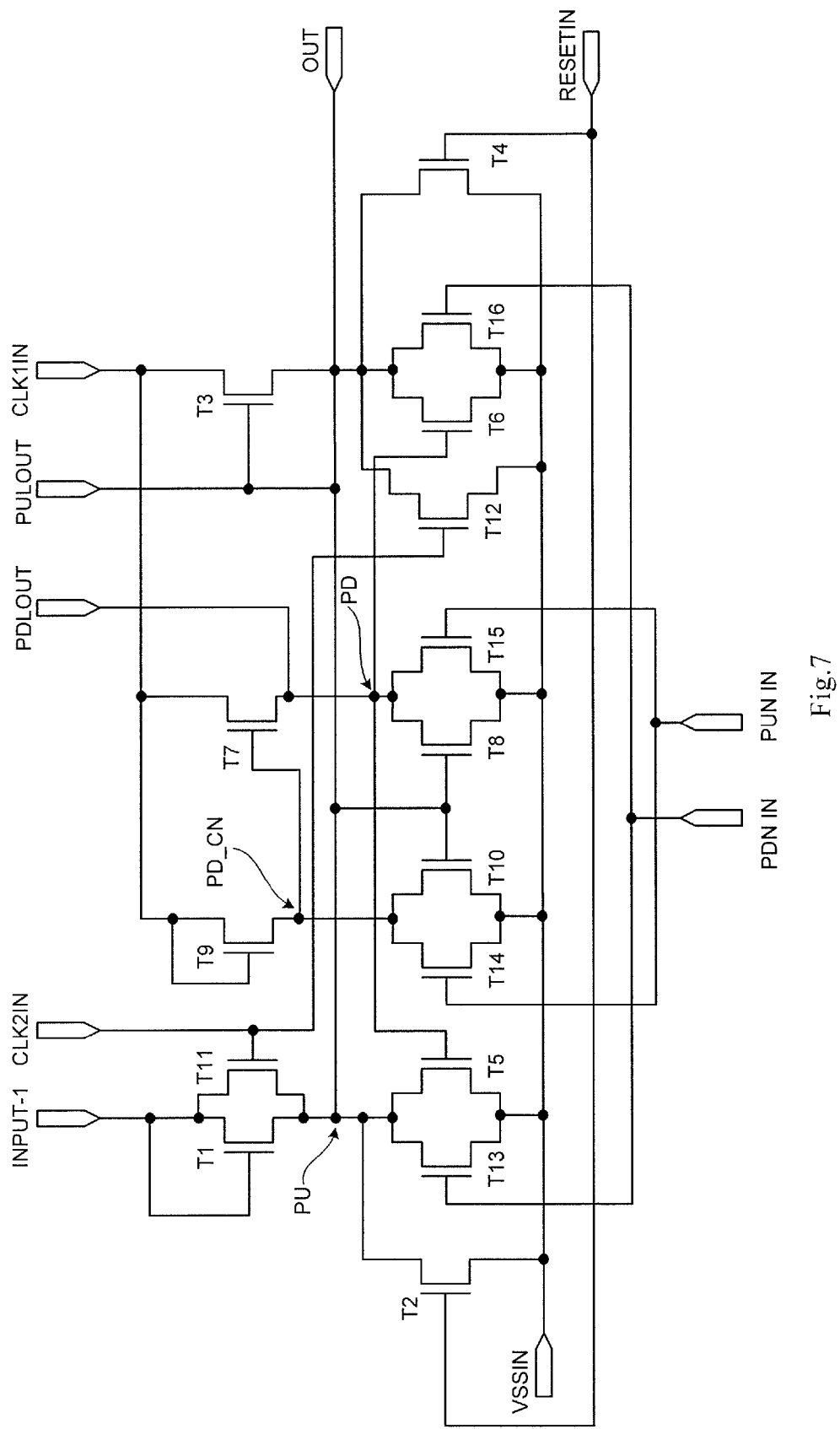
FIG. 7 is a diagram showing a structure for a fourth embodiment of the shift register unit according to the embodiment of present invention.

FIG. 7 is a diagram showing a structure for a fourth embodiment of the shift register unit. This embodiment differs from the second embodiment shown in FIG. 3a in that in shift register unit of the fourth embodiment shown in FIG. 7, the gate and drain of the ninth TFT T9, the drain of the seventh TFT T7 are connected to the first clock signal input terminal (CLK1IN), while in FIG. 3a, the gate and drain of the ninth TFT T9, the drain of the seventh TFT T7 are connected to the second clock signal input terminal (CLK2IN).

In the shift register unit shown in FIG. 3a, during periods of I-2 and II-2, the first clock signal (CLK) and the signal outputted from PU junction are at high level simultaneously. However, since the gate of the ninth TFT T9 is connected to the second clock signal input terminal (CLK2IN), the ninth TFT T9 is turned off. The gate of the seventh TFT T7 is connected to PD_CN junction, and the signal of PD_CN junction is also at low level during the period of I-2, thus the seventh TFT T7 is turned off. The eighth TFT T8 and the tenth TFT T10 are turned on during the period of I-2, and the source of the eighth TFT T8 and the source of the tenth TFT T10 are both connected to the low voltage signal input terminal (CLKBIN), thus the sources of the eighth TFT T8 and the tenth TFT T10 are at low level. During period of I-2, the second clock signal (CLK2) is at low level, thus the drain of the ninth TFT T9 and the source of the tenth TFT T10 are both at low level. Therefore, no leakage current would be generated from the ninth TFT T9 and the tenth TFT T10. The drain of the seventh TFT T7 and the source of the eighth TFT T8 are both at low level. Therefore, no leakage current would be generated from the seventh TFT T7 and the eighth TFT T8. In this way, the power consumption in shift register unit can be reduced.

In shift register unit shown in FIG. 7, during periods of I-2 and II-2, the first clock signal (CLK) and the signal outputted from PU junction are at high level simultaneously. The seventh TFT T7, the eighth TFT T8, the ninth TFT T9 and the tenth TFT T10 are turned on simultaneously, thus a relative large leakage current is generated and power consumption generated in the shift register unit is slightly large.

In shift register unit shown in FIG. 7, a capacitor, of which two terminals are respectively connected to the gate and source of the third TFT, can also be added.

Hereinafter, a principle of operation for the gate driving device for display presented in embodiments of present invention will be described in connection with FIGS. 5a and 5b.

Taking liquid crystal display as an example, liquid crystal display employs a progressive scan manner in which the gates of TFTs on the same row serially connected to the liquid crystal pixels are connected to a same shift register unit, and shift register unit in the gate driving device for display can control the ON and OFF of all TFTs on the same row.

Supposed that there are n rows of liquid crystal pixels in liquid crystal display panel, with reference to the timing chart shown in FIG. 5b, during Th1, a frame starting signal is inputted into the starting signal input terminal (INPUT-1) of the first shift register unit $SR_1$ during the first period. During the second period, the gate driving signal output terminal (OUT) of the first shift register unit $SR_1$ outputs a high level gate driving signal ($OUTPUT_1$) which is inputted into the starting signal input terminal (INPUT-1) of the second shift register unit $SR_2$ simultaneously. During the third period, the gate driving signal output terminal (OUT) of the second shift register unit $SR_2$ outputs a high level gate driving signal ($OUTPUT_2$). In the same way, each of the shift register units sequentially output a high level gate driving signal for controlling a same row of TFTs connected to this shift register unit to be turned on, and the principle is same as that of the second and third periods. During the fourth period, the n-th shift register unit $SR_n$ output a high level gate driving signal ($OUTPUT_n$) which serves as an input signal to the starting signal input terminal (INPUT-1) of (n+1)th shift register unit $SR_{n+1}$ at the same time. During the fifth period, the (n+1)th shift register unit $SR_{n+1}$ outputs a high level gate driving signal ($OUTPUT_{n+1}$) which is not to be used for driving load. That is, the (n+1)th shift register unit $SR_{n+1}$ is not responsible for driving a row of TFTs, and a high level signal ($OUTPUT_{n+1}$) outputted therefrom serves as a reset signal for the n-th shift register unit $SR_n$ and its own.

The gate driving device for display shown in FIG. 5a can include the shift register units shown in FIGS. 3a, 6a and 7.

Figure 8:
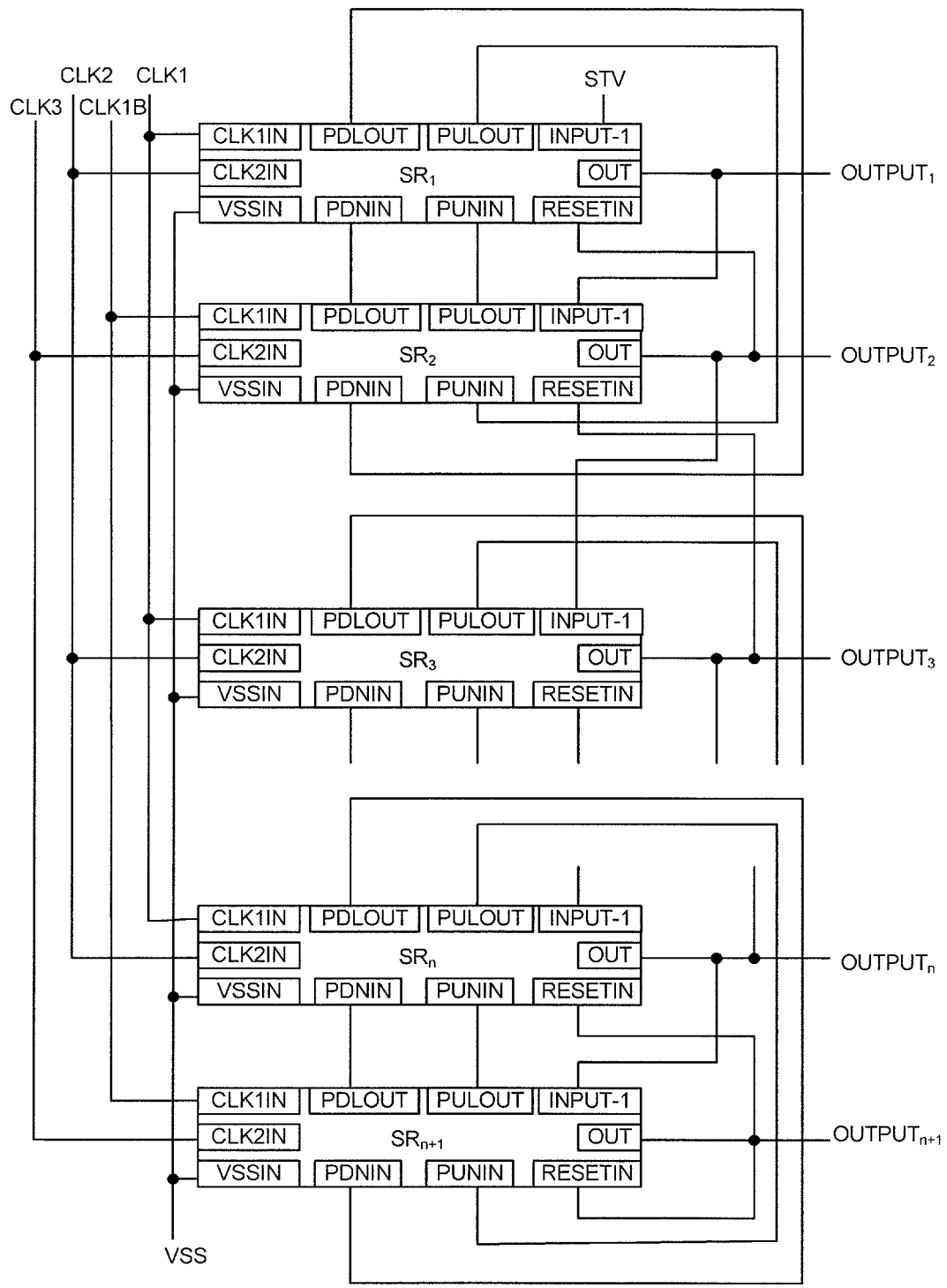
FIG. 8 is a diagram showing a structure for a second embodiment of the gate driving device for display according to the embodiment of present invention.

FIG. 8 is a diagram showing a structure for a second embodiment of the gate driving device for display according to the embodiment of present invention. This embodiment differs from the first embodiment shown in FIG. 5a in that, the connection manner of the first signal input terminal, the first signal output terminal, the second signal input terminal and the second signal output terminal in respective shift register units in this embodiment with the other shift register units is different from that of the embodiment shown in FIG. 5a. In this embodiment, every two shift register units constitute a group, and among the input and output terminals for respective signals in this group of two shift register units, there is a certain connection manner, the details of which is as follows.

A first signal input terminal (PDNIN) of i-th shift register unit $SR_i$ is connected to a first signal output terminal (PDLOUT) of (i+1)th shift register unit $SR_{i+1}$, and a second signal input terminal (PUNIN) of i-th shift register unit $SR_i$ is connected to a second signal output terminal (PULOUT) of (i+1)th shift register unit $SR_{i+1}$, where i is of an odd number and i∈[1, n]. A first signal output terminal (PDLOUT) of i-th shift register unit $SR_i$ is connected to a first signal input terminal (PDNIN) of (i−1)th shift register unit $SR_{i−1}$, and a second signal output terminal (PULOUT) of i-th shift register unit $SR_i$ is connected to a second signal input terminal (PUNIN) of (i−1)th shift register unit $SR_{i−1}$.

Figure 9:
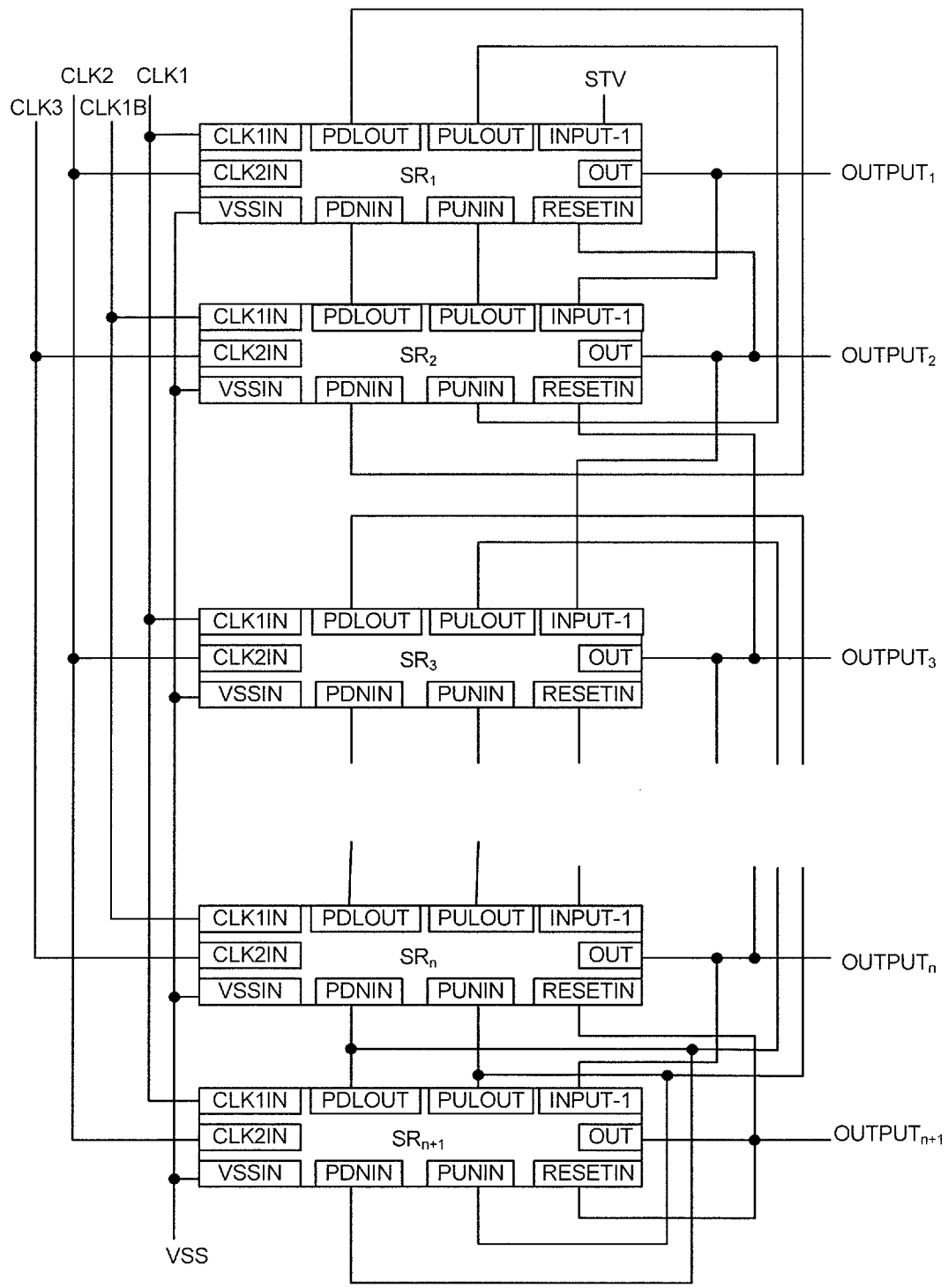
FIG. 9 is a diagram showing a structure for a third embodiment of the gate driving device for display according to the embodiment of present invention.

FIG. 9 is a diagram showing a structure for a third embodiment of the gate driving device for display according to the embodiment of present invention. This embodiment differs from the third embodiment shown in FIG. 9 in that (n+1) is of an odd number in this embodiment, thus the connection manner of input terminals and output terminals for respective signals in the last shift register unit is different from that shown in FIG. 9, and the detailed connection manner is as follows.

The first signal input terminal (PDNIN) of the i-th shift register unit $SR_i$ is connected to the first signal output terminal (PDLOUT) of the (i+1)th shift register unit $SR_{i+1}$, and the second signal input terminal (PUNIN) of the i-th shift register unit $SR_i$ is connected to the second signal output terminal (PULOUT) of the (i+1)th shift register unit, where i∈[1, n−1]. The first signal output terminal (PDLOUT) of the i-th shift register unit $SR_i$ is connected to the first signal input terminal (PDNIN) of the (i−1)th shift register unit $SR_{i−1}$, and the second signal output terminal (PULOUT) of the i-th shift register unit $SR_i$ is connected to the second signal input terminal (PUNIN) of the (i−1)th shift register unit $SR_{i−1}$. The first signal input terminal (PDNIN) and the first signal output terminal (PDLOUT) of the (n+1)th shift register unit $SR_{n+1}$ are both connected to the first signal input terminal (PDNIN) of the n-th shift register unit $SR_n$, and the second signal input terminal (PUNIN) and the second signal output terminal (PULOUT) of the (n+1)th shift register unit $SR_{n+1}$ are connected to the second signal input terminal (PUNIN) of the n-th shift register unit $SR_n$.

The (n+1)th shift register unit $SR_{n+1}$ in FIGS. 5a, 8 and 9 is not used for driving load, and can be regarded as a redundant shift register unit. In gate driving devices shown in FIGS. 5a, 8 and 9, only one redundant shift register unit is included, however, more redundant shift register units can be included practically. The redundant shift register units can be combined together to ensure that gate driving device for display can be reset more reliably.

The embodiment of present invention also provides a liquid crystal display which may comprise the gate driving device for display described in the above embodiments.

In shift register unit, gate driving device for display and liquid crystal display according to the embodiments of present invention, in addition to generating a gate driving signal in accordance with the second clock signal or the third clock signal inputted from the input module, and the frame starting signal, the first clock signal as well as the first signal and the second signal transmitted from the next neighboring shift register unit, the processing module is capable of allowing a level of at least one of first junctions formed by at least two TFTs to be maintained at low level in a frame interval during which the second clock signal or the third clock signal inputted from the input module is maintained at low level. Thus the time period when the first junction is at high level is reduced, the lifespan for the TFTs, of which the gates are connected to the first junction, can be lengthened, and the stability of the shift register units is enhanced.

Finally, it should be explained that, the above embodiments are only used for explaining the technical solution of present invention, and not for limitation thereto. Although the present invention has been explained in details with reference to the preferred embodiments, it should be understood by those skilled in the art that modifications and equivalent alternations may be made to the technical solution of present invention, and these modifications and equivalent alternations can not depart the modified technical solution from the spirit and scope of the technical solution of present invention.

What is claimed is:

1. A gate driving device for display, comprising n+1 shift register units that are sequentially connected, n being a natural number, the shift register units comprising:

an input module for inputting a second clock signal or a third clock signal, and for inputting a frame starting signal, a first clock signal, a low voltage signal, a reset signal as well as a first signal and a second signal transmitted from a next neighboring shift register unit, wherein in one frame interval, the second clock signal is same as an inverse signal of the first clock signal, and the third clock signal is maintained at low level, while in a next neighboring frame interval, the third clock signal is same as the first clock signal, and the second clock signal is maintained at low level, and wherein one frame interval includes a display time of one or more frames;

a processing module connected to the input module, including at least two thin film transistors (TFTs), for generating a gate driving signal in accordance with the second clock signal or the third clock signal inputted from the input module and the frame starting signal, the first clock signal as well as the first signal and the second signal transmitted from the next neighboring shift register unit, and allowing a level of at least one of first junctions formed by at least two TFTs to be maintained at low level in a frame interval during which the second clock signal or the third clock signal inputted from the input module is maintained at low level; and an output module connected to the processing module, for transmitting the gate driving signal generated by the processing module, wherein expect for the first shift register unit and the (n+1)th shift register unit, an output module of each of shift register units is connected to an input module of a previous neighboring shift register unit as well as an input module of a next neighboring shift register unit, a gate driving signal outputted from each of shift register units is transmitted to a previous neighboring shift register unit as a reset signal for the previous neighboring shift register unit, and the gate driving signal outputted from each of shift register units is transmitted to a next neighboring shift register unit as a frame starting signal for the next neighboring shift register unit;

an output module of the first shift register unit is connected to an input module of the second shift register unit, and a gate driving signal outputted from the first shift register unit is inputted to the second shift register unit as a frame starting signal for the second shift register unit; and an output module of the last shift register unit is connected to an input module of the n-th shift register unit, and a gate driving signal outputted from the last shift register unit is transmitted to the n-th shift register unit as a reset signal for the n-th shift register unit; the output module of the last shift register unit is connected to the input module thereof, and a gate driving signal outputted from the last shift register unit is transmitted to the input module thereof as a reset signal thereof, wherein expect for the first shift register unit and the last shift register unit, the gate driving signal output terminal of each of shift register units is connected to a reset signal input terminal of a previous neighboring shift register unit and a starting signal input terminal of a next neighboring shift register unit;

a gate driving signal output terminal of the first shift register unit is connected to a starting signal input terminal of the second shift register unit; and a gate driving signal output terminal of the (n+1)th shift register unit is respectively connected to a reset signal input terminal of the neighboring n-th shift register unit and a reset signal input terminal thereof, and wherein for each of the shift register units, except for the first and the (n+1)th one, a first signal output terminal is connected to a first signal input terminal of a previous neighboring shift register unit, a second signal output terminal is a second signal input terminal of a previous neighboring shift register unit, a first signal input terminal is connected to a first signal output terminal of a next neighboring shift register unit, and a second signal input terminal is connected to a second signal output terminal of a next neighboring shift register unit;

for the first shift register unit, a first signal input terminal is connected to a first signal output terminal of a second shift register unit, and a second signal input terminal is connected to a second signal output terminal of the second shift register unit; and for the (n+1)th shift register unit, a first signal output terminal and a first signal input terminal are both connected to a first signal input terminal of n-th shift register unit, and a second signal output terminal and a second signal input terminal are both connected to a second signal input terminal of the n-th shift register unit.

2. The gate driving device for display according to claim 1, wherein if (n+1) is an even number, a first signal input terminal of i-th shift register unit is connected to a first signal output terminal of (i+1)th shift register unit, and a second signal input terminal of i-th shift register unit is connected to a second signal output terminal of (i+1)th shift register unit, where i is an odd number and i∈[1, n];

a first signal output terminal of i-th shift register unit is connected to a first signal input terminal of (i+1)th shift register unit, and a second signal output terminal of i-th shift register unit is connected to a second signal input terminal of (i+1)th shift register unit; else if (n+1) is an odd number, the first signal input terminal of the i-th shift register unit is connected to the first signal output terminal of the (i+1)th shift register unit, and the second signal input terminal of the i-th shift register unit is connected to the second signal output terminal of the (i+1)th shift register unit, where i is an odd number and i∈[1, n−1];

the first signal output terminal of the i-th shift register unit is connected to the first signal input terminal of the (i+1)th shift register unit, and the second signal output terminal of the i-th shift register unit is connected to the second signal input terminal of the (i+1)th shift register unit; and the first signal input terminal and the first signal output terminal of the (n+1)th shift register unit are both connected to the first signal input terminal of the n-th shift register unit, and the second signal input terminal and the second signal output terminal of the (n+1)th shift register unit are connected to the second signal input terminal of the n-th shift register unit.

3. The gate driving device for display according to claim 1, wherein for the i-th shift register unit, the first clock signal input terminal is used to input the first clock signal, and the second clock signal input terminal is used to input the second clock signal; and for the (i+1)th shift register unit, the first clock signal input terminal is used to input an inverse signal of the first clock signal, and the second clock signal input terminal is used to input the third clock signal.

4. A liquid crystal display comprising the gate driving device for display according to claim 1.

* * * * *